(12) United States Patent
Hsieh et al.

(10) Patent No.: US 10,256,273 B2
(45) Date of Patent: Apr. 9, 2019

(54) HIGH DENSITY CROSS POINT RESISTIVE MEMORY STRUCTURES AND METHODS FOR FABRICATING THE SAME

(71) Applicant: Globalfoundries Singapore Pte. Ltd., Singapore (SG)

(72) Inventors: Curtis Chun-I Hsieh, Singapore (SG); Juan Boon Tan, Singapore (SG); Wanbing Yi, Singapore (SG); Yi Jiang, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 8 days.

(21) Appl. No.: 15/280,185

(22) Filed: Sep. 29, 2016

(65) Prior Publication Data

US 2018/0090543 A1  Mar. 29, 2018

(51) Int. Cl.
*H01L 27/24* (2006.01)
*H01L 45/00* (2006.01)
*H01L 27/18* (2006.01)
*H01L 27/22* (2006.01)
*H01L 39/12* (2006.01)

(52) U.S. Cl.
CPC .......... *H01L 27/2463* (2013.01); *H01L 27/18* (2013.01); *H01L 27/222* (2013.01); *H01L 45/1233* (2013.01); *H01L 39/125* (2013.01); *H01L 45/147* (2013.01)

(58) Field of Classification Search
CPC ..... H01L 27/2463; H01L 43/08; H01L 43/02; H01L 27/222; H01L 27/18; H01L 45/147; H01L 45/1233; H01L 45/1253; H01L 39/125

USPC ............... 257/4, 421, 324; 365/148, 158, 63
See application file for complete search history.

(56) References Cited

U.S. PATENT DOCUMENTS

| | | | |
|---|---|---|---|
| 6,490,190 B1* | 12/2002 | Ramcke | G11C 11/16 365/158 |
| 6,531,371 B2* | 3/2003 | Hsu | G11C 11/15 257/E27.004 |
| 9,406,721 B1* | 8/2016 | Yamamoto | H01L 45/144 |
| 2007/0268746 A1* | 11/2007 | Choi | H01L 21/28273 365/185.05 |
| 2009/0296446 A1* | 12/2009 | Asao | G11C 5/063 365/63 |

* cited by examiner

*Primary Examiner* — Bo Fan
(74) *Attorney, Agent, or Firm* — Lorenz & Kopf, LLP

(57) ABSTRACT

High density resistive memory structures, integrate circuits with high density resistive memory structures, and methods for fabricating high density resistive memory structures are provided. In an embodiment, a high density resistive memory structure includes a semiconductor substrate and a plurality of first electrodes in a first plane in and/or over the semiconductor substrate. Further, the high density resistive memory structure includes a plurality of second electrodes in a second plane in and/or over the semiconductor substrate. The second plane is parallel to the first plane, and each second electrode in the plurality of second electrodes crosses over or under each first electrode in the plurality of first electrodes at a series of cross points. Each second electrode in the plurality of second electrodes is non-linear and the series of cross points formed by each respective second electrode is non-linear.

16 Claims, 3 Drawing Sheets

HIGH DENSITY CROSS POINT RESISTIVE MEMORY STRUCTURES AND METHODS FOR FABRICATING THE SAME

TECHNICAL FIELD

The technical field generally relates to nonvolatile memory structures, and more particularly relates to cross point resistive memory structures.

BACKGROUND

A random access memory ("RAM") type of memory device is typically associated with the main memory available to computers and similar devices. RAM type memory devices are often contrasted with a read-only memory ("ROM") type of memory devices, which are typically associated with a special memory that is either not changed, or changed relatively infrequently. RAM devices mostly include SRAM and DRAM. ROM mostly includes flash memory, EPROM, OTP, EEPROM, PROM and ROM. Some devices such as NovRAM and Battery powered SRAM are hybrid devices using more than one technology.

Although SRAM is the memory device of choice for computer applications, with very fast access times, its volatility, large size and stand-by current limit the total size and applications of the memory. Nonvolatile memory devices such as flash memory are slower to program, and in some cases must be erased a large block at a time before being reprogrammed. DRAM has the smallest cell size, but necessitates a complex refresh algorithm, and is volatile. For new applications in portable applications such as cell phones, personal digital assistants (PDA), digital cameras, and removable "key-chain" or "USB" memory devices, nonvolatility and low power consumption are desirable properties.

Regardless of how the memory devices are used, RAM and ROM overlap in many respects. Both types of memory devices can allow random access reads. Both types of memory can be relatively fast or relatively slow. Although all ROM devices are nonvolatile, so are some RAMs. Although most ROMs cannot change their data once programmed, some ROMs can be re-programmed. RAM, however, is always re-writable.

The ROMs that are capable of data modification typically require long write cycles that erase entire blocks of data prior to new data being written. For example, UV light might be applied to an entire memory block in order to "repair" fused connections so that the block can be re-written with new data. RAM, on the other hand, can read or write to a randomly accessed byte of memory, typically performing either operation in a standard cycle.

Conventional nonvolatile RAM and ROM devices require three terminal MOSFET-based structures. The layouts of such devices are not ideal, as they require large feature sizes for each memory cell.

However, not all memory elements require three terminals. Certain complex metal oxides (CMOs), for example, can retain a resistive state after being exposed to an electronic pulse, which can be generated from two terminals. For example, materials having a perovskite structure, among them colossal magnetoresistance (CMR) materials and high temperature superconductivity (HTSC) materials, are materials that have electrical resistance characteristics that can be changed by external influences. For instance, the properties of materials having perovskite structures, especially for CMR and HTSC materials, can be modified by applying one or more short electrical pulses to a thin film or bulk material. The electric field strength or electric current density from the pulse, or pulses, is sufficient to switch the physical state of the materials so as to modify the properties of the material. The pulse is of low enough energy so as not to significantly damage the material. Multiple pulses may be applied to the material to produce incremental changes in properties of the material. One of the properties that can be changed is the resistance of the material. The change may be at least partially reversible using pulses of opposite polarity from those used to induce the initial change. Similarly, magnetic RAM (MRAM) requires only two terminals to deliver a magnetic field to the memory element. Other two terminal devices include Ovonic Unified Memory (OUM), which uses chalcogenic layers of material, and various types of ferroelectric memory. With only two terminals, it has been theorized that a resistive memory structure can be arranged in a cross point architecture.

Accordingly, it is desirable to provide a high density resistive memory structure. Further, it is desirable to provide a resistive memory structure utilizing a cross-point array of non-linear electrodes. Also, it is desirable to provide a method for fabricating high density resistive memory structures. Furthermore, other desirable features and characteristics will become apparent from the subsequent detailed description and the appended claims, taken in conjunction with the accompanying drawings and this background.

BRIEF SUMMARY

High density cross point resistive memory structures, integrated circuits with high density cross point resistive memory structures, and methods for fabricating high density cross point resistive memory structures are provided. In an exemplary embodiment, a high density cross point resistive memory structure includes a semiconductor substrate and a plurality of first electrodes in a first plane in and/or over the semiconductor substrate. Further, the high density cross point resistive memory structure includes a plurality of second electrodes in a second plane in and/or over the semiconductor substrate. The second plane is parallel to the first plane, and each second electrode in the plurality of second electrodes crosses over or under each first electrode in the plurality of first electrodes at a series of cross points. Each second electrode in the plurality of second electrodes is non-linear and the series of cross points formed by each respective second electrode is non-linear.

In another exemplary embodiment, an integrated circuit with a high density cross point resistive memory structure includes a semiconductor substrate and first electrodes extending in a first direction in a first plane in and/or over the semiconductor substrate. Further, the integrated circuit includes a second electrode extending in a second direction in a second plane in and/or over the semiconductor substrate. The second direction is perpendicular to the first direction and the second electrode crosses over or under each first electrode at a respective cross point. Adjacent cross points are distanced from one another in the first direction and in the second direction.

In yet another exemplary embodiment, a method for manufacturing a cross point resistive memory structure includes providing a semiconductor substrate and forming a plurality of bottom electrodes in or over the semiconductor substrate. The method further includes forming a plurality of top electrodes over the bottom electrodes. Each top electrode in the plurality of top electrodes crosses over each bottom electrode in the plurality of bottom electrodes at a series of cross points. The series of cross points formed by each respective top electrode or each respective bottom electrode is non-linear.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the integrated circuits, methods for fabricating integrated circuits, and methods for fabricating electrical interconnects for III-V devices. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. Further, it is noted that semiconductor devices include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "under", "lower", "higher" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

Figure 1:
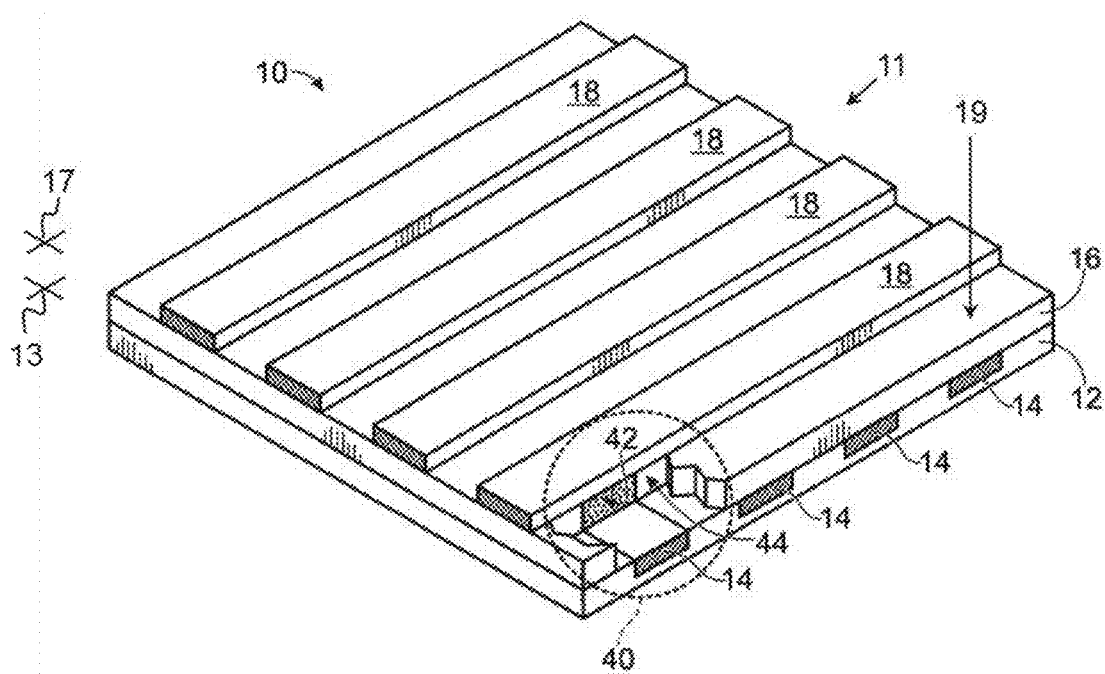
FIG. 1 is an isometric view of a cross point resistive memory structure.

FIG. 1 shows a cross point resistive memory structure 10 with a memory array area 11. The memory structure 10 includes a substrate 12, such as a semiconductor substrate. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as amorphous silicon materials, polycrystalline or crystalline silicon materials, and silicon admixed with other elements such as germanium, carbon, and the like. In addition, "semiconductor material" encompasses other materials such as relatively pure and impurity-doped germanium, gallium arsenide, zinc oxide, glass, titanium nitride, lanthanum aluminate ($LaAlO_3$) and the like. In an exemplary embodiment, the semiconductor material is a silicon substrate, such as crystalline silicon. The silicon substrate may be a bulk silicon wafer or may be a thin layer of silicon (on an insulating layer commonly known as silicon-on-insulator or SOI) that, in turn, is supported by a carrier wafer. As referred to herein, a material that includes a recited element/compound includes the recited element/compound in an amount of at least 25 weight percent based on the total weight of the material unless otherwise indicated.

As shown, a plurality of bottom electrodes 14 is formed in and/or over the substrate 12. The bottom electrodes 14 are formed in and define a bottom plane 13. For example, each bottom electrode 14 may have an upper surface in or parallel to the bottom plane 13 and each bottom electrode 14 may have a lower surface in or parallel to the bottom plane 13. Exemplary bottom electrodes 14 are made of conductive oxide or another suitable conductive material. In an exemplary embodiment, the conductive material is a material, such as $YBa_2Cu_3O_7$ (YBCO), that allows the epitaxial growth of an overlying perovskite material. In another embodiment, the conductive material is platinum. Exemplary bottom electrodes 14 have a thickness of from about 5 nanometers (nm) to about 500 nm. In an exemplary embodiment, the bottom electrodes 14 are formed by etching trenches in the substrate 12, depositing the conductive material in the trenches, and planarizing or polishing the conductive material until level with the substrate 12. The planarizing can be accomplished using chemical mechanical planarization (CMP) or other suitable techniques. Alternatively, the bottom electrodes 14 may be deposited and patterned without first forming a trench and without polishing.

In FIG. 1, an active or resistive layer 16 is deposited overlying the plurality of bottom electrodes 14. An exemplary resistive layer 16 is a material capable of having its resistivity changed in response to an electrical signal. The active material may be a perovskite material, such as a colossal magnetoresistive (CMR) material or a high temperature superconducting (HTSC) material, for example $Pr_{0.7}Ca_{0.3}MnO_3$ (PCMO). Another example of a suitable material is $Gd_{0.7}Ca_{0.3}BaCo_2O_{5+\delta}$. An exemplary resistive layer has a thickness of from about 5 nm to about 500 nm. The resistive layer 16 can be deposited using any suitable deposition technique including pulsed laser deposition, radio frequency-sputtering, e-beam evaporation, thermal evaporation, metal organic deposition, sol gel deposition, and metal organic chemical vapor deposition. The resistive layer 16 may be removed from outside the memory array area by ion milling or another suitable process. In other embodiments, a large recessed area may be formed before depositing perovskite material therein followed by using chemical mechanical polishing (CMP) to remove the perovskite material outside of the recessed area to form resistive layer 16.

Further, a plurality of top electrodes 18 are formed in and/or over the substrate 12. Specifically, the plurality of top electrodes 18 are formed over the resistive layer 16 and over the bottom electrodes 14, such that the resistive layer 16 is interposed between the bottom electrodes 14 and the top electrodes 18. Exemplary top electrodes 18 are formed from a conductive material such as, but not limited to, platinum, copper, silver, or gold. The top electrodes 18 are formed in and define a top plane 17. For example, each top electrode 18 may have an upper surface in or parallel to the top plane 17 and each top electrode 18 may have a lower surface in or parallel to the top plane 17. The top plane 17 may be overlying and parallel to the bottom plane 13. Alternatively, the electrodes 14 and 18 may be re-positioned or re-ordered such that plane 13 is overlying plane 18.

In the cross point resistive memory structure 10, each bottom electrode 14 is linear and parallel to the other bottom electrodes 14 in the plurality of bottom electrodes 14. Further, each top electrode 18 is linear, i.e., formed with side edges parallel to a linear axis, and parallel to the other top electrodes 18 in the plurality of top electrodes 18. The bottom electrodes 14 and the top electrodes 18 are arranged in a cross point arrangement in which the top electrodes 18 cross over the bottom electrodes 14, and the bottom electrodes 14 cross under the top electrodes 18, at cross points 19 in a regular pattern. As used herein, a "cross point" refers to each position or area where a top electrode 18 crosses over a bottom electrode 14. As shown, the top electrodes 18 and the bottom electrodes 14 are arranged at an angle of about 90 degrees with respect to each other, i.e., in a perpendicular relationship, albeit in parallel planes 13 and 17. The top electrodes 18 and the bottom electrodes 14 can each function as either word lines or bit lines as part of a cross point memory array.

FIG. 1 illustrates the memory array area 11. It should be clear that in an actual device, the substrate 12, the bottom electrodes 14 and the top electrodes 18 may extend well beyond the memory array area 11, which is defined by presence of the resistive layer 16. An exemplary resistive layer 16 is substantially continuous, such that the resistive layer extends unbroken across more than one cross point.

In FIG. 1, the resistive layer 16 is shown with a region 40 (shown by a dashed circle) to illustrate the region as transparent for illustration purposes. A bit region 42 is shown. The bit region 42 is a portion of the resistive layer 16 interposed between the bottom electrodes 14 and the top electrodes 18 such that an electrical signal passing between the top and bottom electrodes passes primarily through the bit region. Each bit region corresponds to a cross point 19. Under normal operation, the bit region 42 is formed in the resistive layer by having its resistivity changed in response to an electrical signal. A bulk region 44 of the resistive layer 16 is contiguous with the bit region 42. That portion of the resistive layer 16 that is not changed by an electrical signal during normal operation forms the bulk region 44. The bit region 42 acts as a variable resistor that can be changed between at least two resistivity values. Changes to the resistivity of the bit region 42 may be reversible. The reversibility of the resistivity change may incorporate some hysteresis. For some applications, such as write once read many (WORM) the resistivity change need not be reversible at all.

Figure 2:
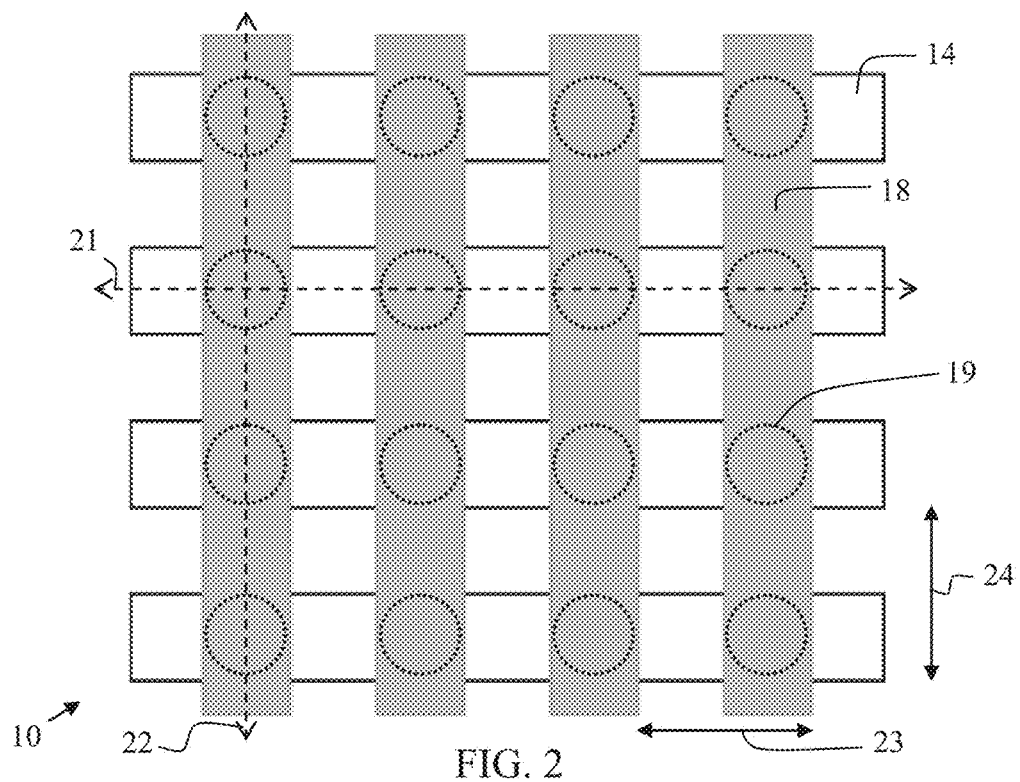
FIG. 2 is an overhead view of a cross point resistive memory structure having linear top and bottom electrodes.

Referring now to FIG. 2, an exemplary geometric layout of the cross point resistive memory structure 10 of FIG. 1 is shown in an overhead schematic view. As shown, the bottom electrodes 14 are linear, parallel to one another, and extend in a first direction 21 (the X-direction in the orientation of FIG. 2). Further, the top electrodes 18 are linear, parallel to one another, and extend in a second direction 22 (the Y-direction in the orientation of FIG. 2). The second direction 22 is substantially perpendicular to the first direction 21. As further shown in FIG. 2, the bottom electrodes 14 are formed with a uniform pitch or pitch distance 23. Further, the top electrodes 18 are formed with a uniform pitch or pitch distance 24.

Each bottom electrode 14 crosses under the top electrodes 18 at a series of cross points 19. Likewise, each top electrode 18 crosses over the bottom electrodes 18 at a series of cross points 19. As a result of the geometric arrangement of the bottom electrodes 14 and top electrodes 18, each cross point 19 corresponding to a respective bottom electrode 14 is separated from next adjacent cross points 19 of the same bottom electrode 14 in the X-direction 21 by a distance equal to the pitch 23 less the thickness of one cross point 19. Further, each cross point 19 corresponding to a respective top electrode 18 is separated from next adjacent cross points 19 of the same top electrode 18 in the Y-direction 22 by a distance equal to the pitch 24 less the thickness of one cross point 19. As used herein, a cross point 19 is "adjacent" to another cross point 19 when no other cross point 19 is located between the adjacent cross points 19 on the same bottom electrode 14 or on the same top electrode 18.

Figure 3:
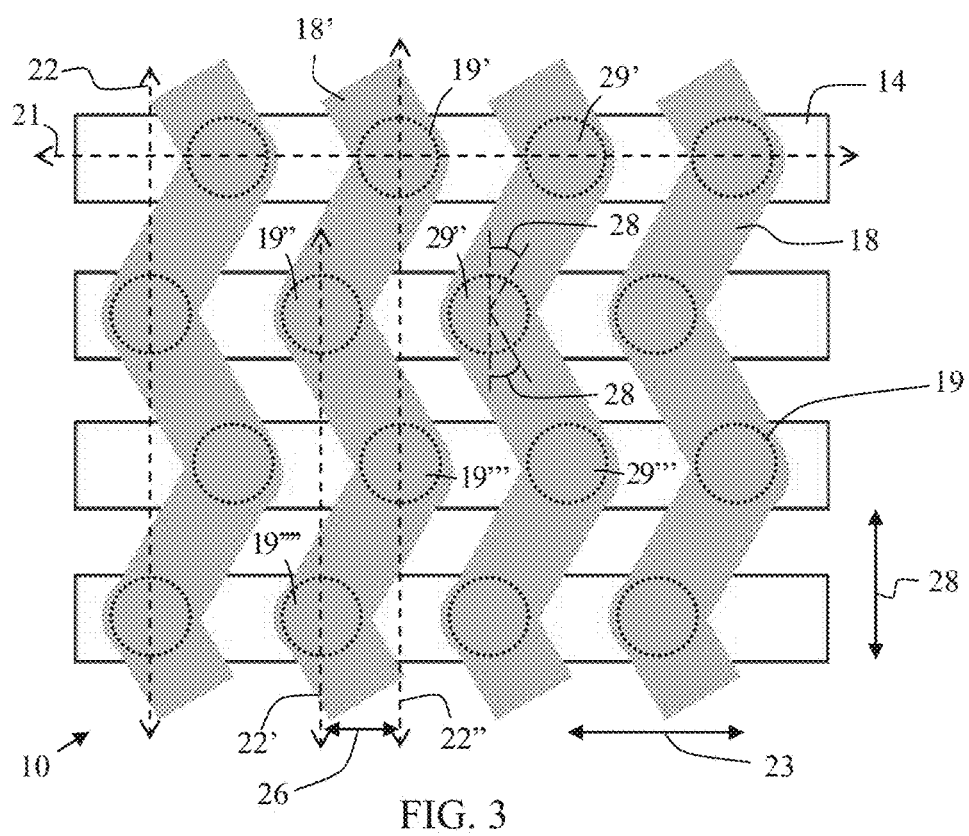
FIG. 3 is an overhead view of the cross point resistive memory structure having at least one array of non-linear electrodes in accordance with an embodiment herein.

FIG. 3 illustrates another exemplary geometric layout for the cross point resistive memory structure 10 of FIG. 1. In FIG. 3, the bottom electrodes 14 are linear, parallel to one another, and extend in the first direction 21 (the X-direction in the orientation of FIG. 3). As a result, cross points 19 corresponding to a same or common bottom electrode 14 are formed along a same axis in the X-direction. In other words, a series of cross points 19 corresponding to a same or common bottom electrode 14 is linear.

Unlike the embodiment of FIG. 2, the top electrodes 18 in FIG. 3 are non-linear, i.e., the top electrode does not continuously extend along a single axis. While the top electrodes 18 extend generally in the second direction 22 (the Y-direction in the orientation of FIG. 3), top electrodes 18 also extend back and forth in the X-direction 21 such as in a waveform. Cross points 19 corresponding to a same or common top electrode 18 are not formed along a same axis in the Y-direction 22. Rather, cross points 19 corresponding to a same or common top electrode 18 are staggered. In the embodiment of FIG. 3, cross points 19 corresponding to each top electrode 18, such as selected top electrode 18', alternate between locations along axis 22' and parallel axis 22". As shown, axis 22' and axis 22" are separated by a distance 26. Thus, cross points 19', 19'', 19''', 19'''' corresponding to a top electrode 18' are non-linearly situated with respect to each other and form a series of cross points. More specifically, the series of cross points 19', 19'', 19''', 19'''' corresponding to a top electrode 18' forms two parallel lines along axes 22' and 22".

As shown, a selected cross point 19, e.g., cross point 29'', is offset from each cross point adjacent the selected cross point, e.g., cross points 29' and 29''', by an angle 26 from an axis in the Y-direction 22. In an exemplary embodiment, angle 26 is from about 15 to about 45 degrees, such as about 30 degrees.

While the top electrodes 18 in FIG. 3 may be formed with a same minimum pitch 23 as in the embodiment of FIG. 2, the bottom electrodes 14 in FIG. 3 may be formed with a reduced pitch 28 that is less than the pitch 24 in FIG. 2. Specifically, because adjacent cross points 19 along a same or common top electrode 18 are separated from one another in both the X-direction 21 and the Y-direction 22, rather than being separated from one another in only the Y-direction 22 as in FIG. 2, where adjacent cross points 19 are not distanced from one another in the X-direction 21, the distance between adjacent cross points 19 in the Y-direction 22 may be reduced while still retaining sufficient distance between those adjacent cross point 19. Specifically, for the selected top electrode 18', nearest adjacent cross points 19 are separated from one another by a distance equal to the square root of the sum of the square of pitch 28 and the square of distance 26, less the thickness of one cross point 19.

As a result of the geometric layout of the cross point resistive memory structure 10 of FIG. 3, a same number of cross points 19 may be packed into a smaller area of substrate without violating any minimum distance rule between adjacent cross points 19. Therefore, the embodiment of FIG. 3 provides a high density cross point resistive memory structure 10 than the embodiment shown in FIG. 2. While FIG. 3 illustrates an embodiment in which the top electrodes 18 are non-linear and cross over linear bottom electrodes 14, it is contemplated that the bottom electrodes 14 are also non-linear and cross under linear top electrodes 18.

Figure 4:
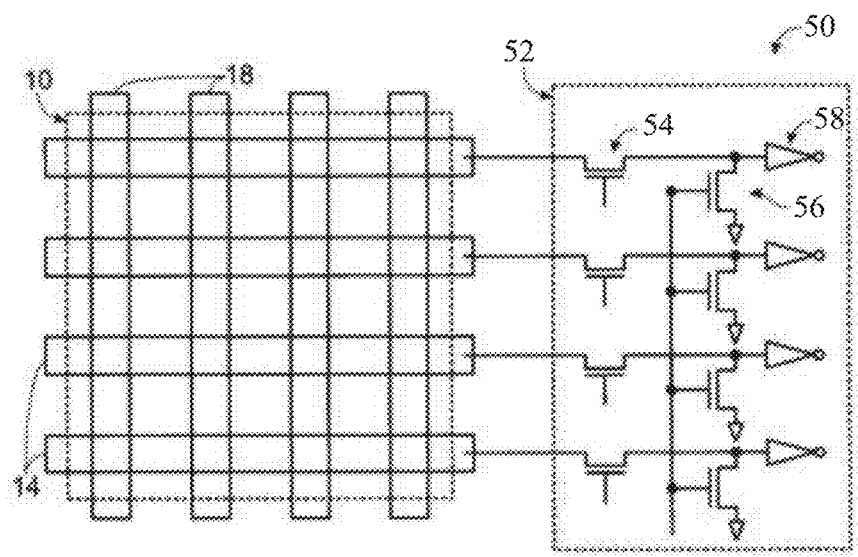
FIG. 4 is a schematic view of a memory readout circuit connected to a cross point resistive memory structure.

Referring now to FIG. 4, a memory device 50 including a memory structure 10 connected to a memory circuit 52 is shown. While the memory structure 10 is shown with linear bottom and top electrodes 14 and 18, the bottom and top electrodes 14 and 18 could be non-linear as shown in FIG. 3. The memory circuit 52 includes at least one bit pass transistor 54 connected to at least one load transistor 56 and at least one inverter 58. These structures are shown schematically, as the formation of the individual semiconductor elements are conventional.

Figure 5:
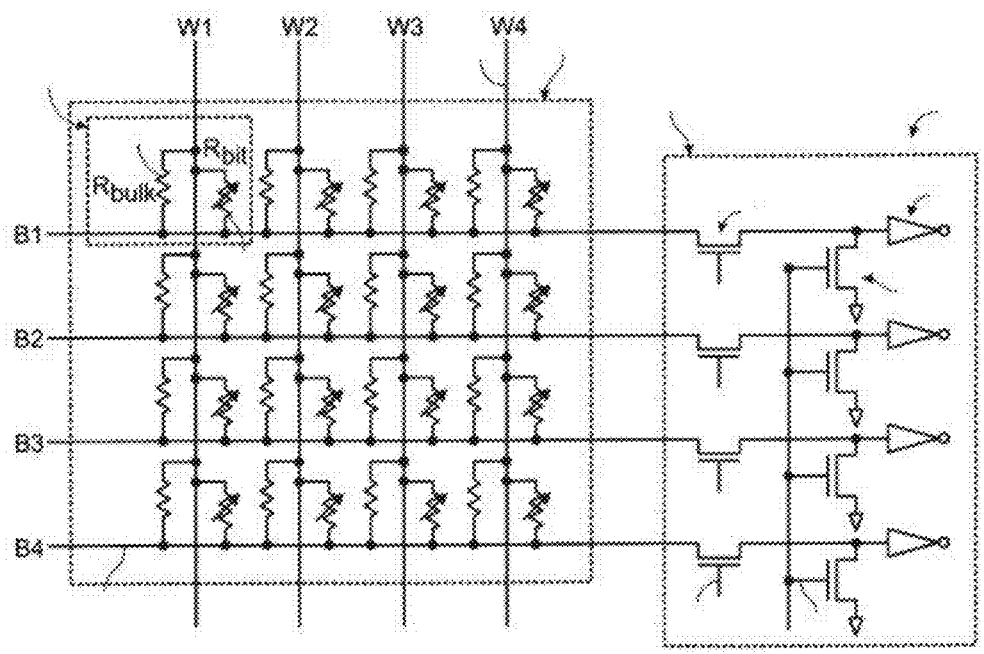
FIG. 5 is a schematic view of a cross point resistive memory structure with readout circuit.

In an exemplary embodiment of a method of making the memory device 50, one or more of transistor structures, interconnects or other components of the memory circuit 52 may be formed prior to the formation of the memory structure 10. By forming components of the memory circuit 52 prior to the memory structure 10, possible degradation of the resistive layer 16 due to subsequent processing is reduced, or eliminated FIG. 5 shows a schematic diagram of a 16 bit, 4×4-memory array, memory block 50. The memory block 50 includes the memory structure 10 connected to the memory circuit 52. In this schematic view the resistive layer is shown as being an array of resistors connected between the lower electrodes 14, which are also designated as bit lines B1 through B4, and the upper electrodes 18, which are also designated as word lines W1 through W4. Alternatively, the lower electrodes could be the word lines and the upper electrodes could be the bit lines. The bit lines are connected to the memory circuit 52. As shown, the lower electrodes are bit lines, so the lower electrodes are connected to the memory circuit 52.

Looking at the memory structure 10, each bit 60 can be treated as including primarily a bit resistor 62 with an accompanying bulk resistor 64 in parallel. This array does not require a gated transistor for each bit. There is also no need for a separate capacitor as any data value is stored using a changing resistance of each bit resistor 62. The total resistance of each bit is going to be controlled primarily by the bit resistor 62, which acts as a variable resistor. The bit resistor 62 has a resistance that can be changed between at least two values in response to an electrical signal, including a high resistance state and a low resistance state. In an exemplary embodiment, the bulk resistor 64 will have a higher resistance than the bit resistor 62, especially when the bit resistor is in a low resistance state.

Referring now to the memory circuit 52, each bit line is connected to the bit pass transistor 54. The bit pass transistor 54 has a bit pass gate 74. The bit pass gate 74 contributes to determining which bit is being programmed or read out. The bit pass transistor is connected to the load transistor 56, which has a load gate 76, and the inverter 58. The load transistor is used to determine which memory block is being programmed or read out. The inverter is used in combination with the load transistor to set the output between two voltage levels, so that a binary state can be read out.

Referring again to the memory array area, an exemplary resistive layer will have a higher resistivity than the resistivity of the low resistance state of the bit region, which corresponds to the bit resistor 62. If necessary, the resistivity of the resistive layer can be increased by applying one or more electrical pulses to the resistive layer during manufacturing.

As described herein, a cross point resistive memory structure is provided with an improved geometry to allow inclusion of more cross points within a standard area of substrate, or to reduce the area of substrate need to hold a selected number of cross points. Use of at least one array or plurality of non-linear electrodes provides for improved packing of cross points in the memory structure area of the substrate. Further, the processes described herein are similar to processes in conventional processing such that necessary process equipment and actions are available.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A high density cross point resistive memory structure comprising:
   a semiconductor substrate;
   a plurality of first electrodes in a first plane in and/or over the semiconductor substrate;
   a plurality of second electrodes in a second plane in and/or over the semiconductor substrate, wherein the second plane is parallel to the first plane, wherein each second electrode in the plurality of second electrodes crosses over or under each first electrode in the plurality of first electrodes at a series of cross points located in the second plane, and wherein no second electrode in the plurality of second electrodes includes a series of cross points that continuously extend along a single axis.

2. The high density cross point resistive memory structure of claim 1 wherein the series of cross points formed by each respective second electrode forms two parallel lines.

3. The high density cross point resistive memory structure of claim 1 wherein each first electrode in the plurality of first electrodes is linear.

4. The high density cross point resistive memory structure of claim 1 wherein each first electrode in the plurality of first electrodes is linear, and wherein the series of cross points formed by each first electrode in the plurality of first electrodes is linear.

5. The high density cross point resistive memory structure of claim 1 wherein the first plane is overlying the second plane.

6. The high density cross point resistive memory structure of claim 1 wherein the second plane is overlying the first plane.

7. The high density cross point resistive memory structure of claim 1 further comprising a resistive layer formed between the plurality of first electrodes and the plurality of second electrodes.

8. The high density cross point resistive memory structure of claim 1 wherein, within the series of cross points formed by a selected second electrode, a selected cross point is offset from each cross point adjacent the selected cross point by about 30 degrees.

9. A method for manufacturing a cross point resistive memory structure, the method comprising:
providing a semiconductor substrate;
forming a plurality of bottom electrodes in or over the semiconductor substrate; and
forming a plurality of top electrodes over the plurality of bottom electrodes, wherein each top electrode in the plurality of top electrodes crosses over each bottom electrode in the plurality of bottom electrodes at cross points located in a common plane, and wherein a series of cross points formed by each respective top electrode or each respective bottom electrode includes a first cross point, a second cross point directly adjacent the first cross point, and a third cross point directly adjacent the second cross point, wherein the first cross point, the second cross point and the third cross point do not lie in a single axis.

10. The method of claim 9 wherein no top electrode extends continuously along a single axis.

11. The method of claim 9 wherein no bottom electrode extends continuously along a single axis.

12. The method of claim 9 further comprising forming a resistive layer formed over the plurality of bottom electrodes, wherein forming the plurality of top electrodes comprises forming the plurality of top electrodes over the resistive layer.

13. A high density cross point resistive memory structure comprising:
a semiconductor substrate;
lower electrodes in a lower plane in and/or over the semiconductor substrate; and
an upper electrode in an upper plane in and/or over the semiconductor substrate, wherein the upper plane is parallel to the lower plane, wherein the upper electrode crosses over each lower electrode and includes upper cross point regions lying directly over respective lower cross point regions in the lower electrodes, and wherein the upper electrode does not continuously extend along a single axis.

14. The high density cross point resistive memory structure of claim 13 wherein:
the lower electrodes in the lower plane include a first lower electrode, a second lower electrode, and a third lower electrode;
the upper cross point regions include a first upper cross point region lying directly over a first lower cross point region in the first lower electrode;
the upper cross point regions include a second upper cross point region lying directly over a second lower cross point region in the second lower electrode;
the upper cross point regions include a third upper cross point region lying directly over a third lower cross point region in the third lower electrode; and
no line includes the first upper cross point region, the second upper cross point region, and the third upper cross point region.

15. The high density cross point resistive memory structure of claim 14 wherein:
the upper electrode extends in an upper direction defined by a line passing through the first upper cross point region and the second upper cross point region; and
each of the lower electrodes extends in a lower direction perpendicular to the upper direction.

16. The high density cross point resistive memory structure of claim 13 wherein:
the lower electrodes in the lower plane include a first lower electrode, a second lower electrode, a third lower electrode, and a fourth lower electrode;
the upper cross point regions include a first upper cross point region lying directly over a first lower cross point region in the first lower electrode;
the upper cross point regions include a second upper cross point region lying directly over a second lower cross point region in the second lower electrode;
the upper cross point regions include a third upper cross point region lying directly over a third lower cross point region in the third lower electrode;
the upper cross point regions include a fourth upper cross point region lying directly over a fourth lower cross point region in the fourth lower electrode;
a first line passed through and is defined by the first upper cross point region and the third upper cross point region;
a second line passed through and is defined by the second upper cross point region and the fourth upper cross point region; and
the first line is distanced from and parallel to the second line.

* * * * *